(12) United States Patent
Hsiung

(10) Patent No.: US 9,502,524 B2
(45) Date of Patent: Nov. 22, 2016

(54) COMPOUND SEMICONDUCTOR DEVICE HAVING GALLIUM NITRIDE GATE STRUCTURES

(71) Applicant: TAIWAN SEMICONDUCTOR MANUFACTURING CO., LTD., Hsin-Chu (TW)

(72) Inventor: Chih-Wen Hsiung, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/724,876

(22) Filed: May 29, 2015

(65) Prior Publication Data

US 2015/0270371 A1    Sep. 24, 2015

Related U.S. Application Data

(62) Division of application No. 13/744,483, filed on Jan. 18, 2013, now Pat. No. 9,048,174.

(51) Int. Cl.
*H01L 29/15* (2006.01)
*H01L 21/3205* (2006.01)
(Continued)

(52) U.S. Cl.
CPC ..... *H01L 29/66462* (2013.01); *H01L 21/0254* (2013.01); *H01L 21/28575* (2013.01);
(Continued)

(58) Field of Classification Search
CPC .............. H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
USPC ........... 257/76, 547, 194, 109, 472, 311, 77, 257/615, 409, 192, 190, 213, 368
See application file for complete search history.

(56) References Cited

U.S. PATENT DOCUMENTS

| 6,914,273 | B2 | 7/2005 | Ren et al. |
| 2006/0138456 | A1* | 6/2006 | Parikh .................. H01L 29/518 257/194 |

(Continued)

FOREIGN PATENT DOCUMENTS

TW    201205806 A1    2/2012

OTHER PUBLICATIONS

Official Action issued May 14, 2014 in counterpart DE Application No. 10 2013 105 701.2.
(Continued)

*Primary Examiner* — Selim Ahmed
*Assistant Examiner* — Moin Rahman
(74) *Attorney, Agent, or Firm* — Duane Morris LLP

(57) ABSTRACT

The present disclosure provides a semiconductor structure. The semiconductor structure includes a buffer layer on a substrate, an graded aluminum gallium nitride (AlGaN) layer disposed on the buffer layer, a gallium nitride (GaN) layer disposed on the graded AlGaN layer, a second AlGaN layer disposed on the GaN layer and a gate stack disposed on the second AlGaN layer. The gate stack includes one or more of a III-V compound p-doped layer, a III-V compound n-doped layer, an aluminum nitride (AlN) layer between the III-V compound p-doped and n-doped layers, and a metal layer formed over the p-doped, AlN, and n-doped layers. A dielectric layer can also underlie the metal layer.

20 Claims, 17 Drawing Sheets

(51) Int. Cl.
  H01L 29/66    (2006.01)
  H01L 21/76    (2006.01)
  H01L 29/20    (2006.01)
  H01L 29/778   (2006.01)
  H01L 27/06    (2006.01)
  H01L 29/51    (2006.01)
  H01L 21/02    (2006.01)
  H01L 21/285   (2006.01)
  H01L 21/8252  (2006.01)
  H01L 29/201   (2006.01)
  H01L 29/205   (2006.01)
  H01L 29/207   (2006.01)

(52) U.S. Cl.
  CPC ........... *H01L21/76* (2013.01); *H01L 21/8252* (2013.01); *H01L 27/0605* (2013.01); *H01L 29/201* (2013.01); *H01L 29/2003* (2013.01); *H01L 29/205* (2013.01); *H01L 29/207* (2013.01); *H01L 29/51* (2013.01); *H01L 29/517* (2013.01); *H01L 29/518* (2013.01); *H01L 29/7787* (2013.01)

(56) References Cited

U.S. PATENT DOCUMENTS

| | | | |
|---|---|---|---|
| 2008/0315256 A1* | 12/2008 | Ohta et al. | 257/194 |
| 2010/0109015 A1* | 5/2010 | Ueno | 257/76 |
| 2010/0264461 A1 | 10/2010 | Rajan et al. | |
| 2012/0025270 A1 | 2/2012 | Chang et al. | |
| 2012/0056191 A1 | 3/2012 | Endo et al. | |
| 2012/0193637 A1 | 8/2012 | Kalnitsky et al. | |
| 2012/0235209 A1* | 9/2012 | Briere et al. | 257/194 |

OTHER PUBLICATIONS

Official Action issued Jul. 22, 2015 in counterpart TW patent application.

* cited by examiner

COMPOUND SEMICONDUCTOR DEVICE HAVING GALLIUM NITRIDE GATE STRUCTURES

This application is a division of U.S. patent application Ser. No. 13/744,483, filed Jan. 18, 2013, which is incorporated by reference herein in its entirety.

BACKGROUND

In semiconductor technology, gallium nitride (GaN) is used to form various integrated circuit devices, such as high power field-effect transistors, metal insulator semiconductor field effect transistors (MISFETs), high frequency transistors, and high electron mobility transistors (HEMTs).

In a conventional semiconductor device, gate structures are formed using fluoride-based plasma treatment techniques; however, such techniques suffer control issues for a device having plural enhanced mode (E-mode) or depletion mode (D-mode) transistors or devices on the respective circuit. Therefore, a compound semiconductor gate structure and method of forming such a gate structure are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

DETAILED DESCRIPTION

Figure 1A:
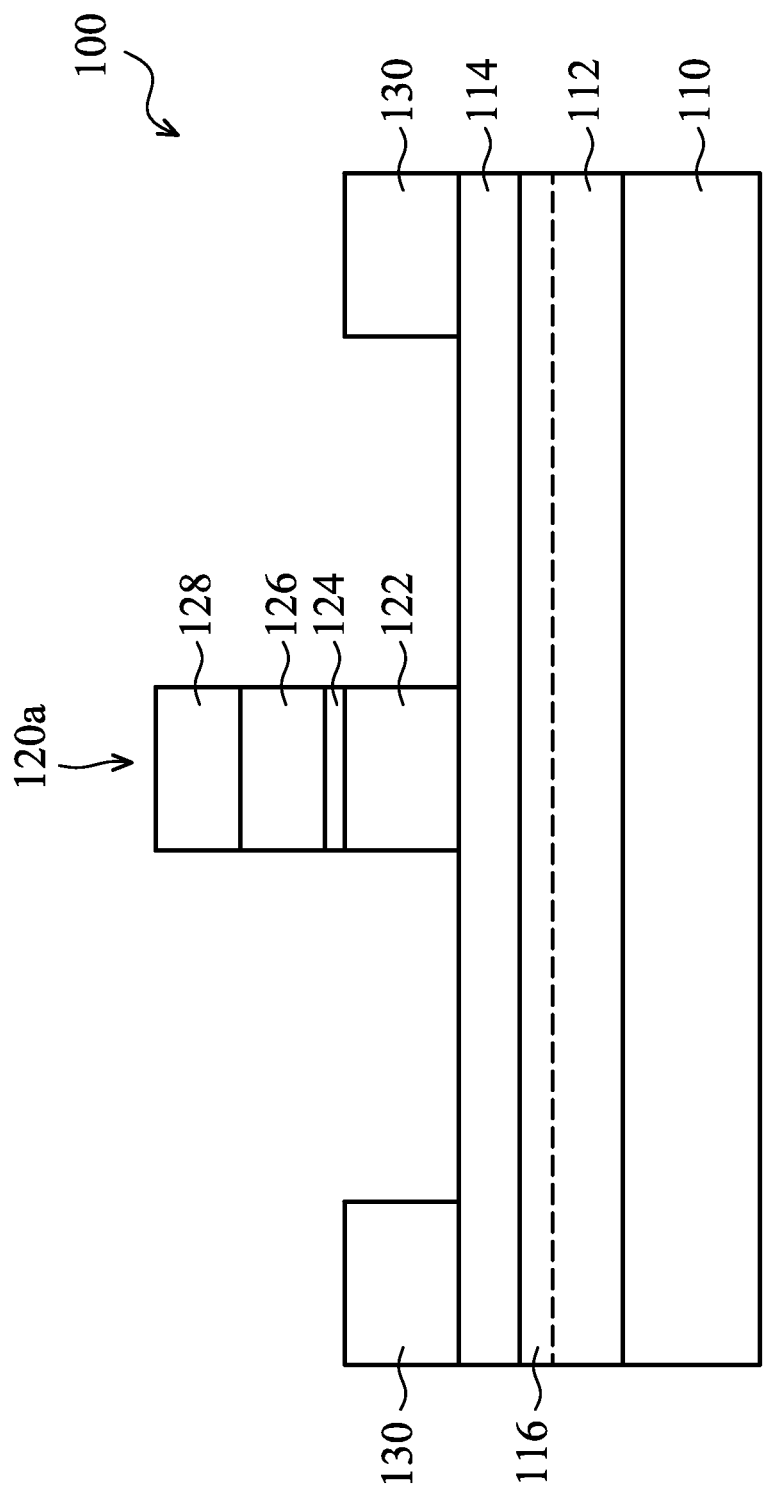
FIGS. 1a through 1d are sectional views of an embodiment of a semiconductor structure.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

FIGS. 1a through 1d are sectional views of an embodiment of a semiconductor structure. With reference to FIGS. 1a through 1d, the semiconductor structure 100 includes a silicon substrate 110. Alternatively, the substrate can be a silicon carbide (SiC) substrate, a sapphire substrate, or other substrate used in the industry. In one embodiment, the semiconductor structure 100 includes a first III-V compound layer 112 formed on the substrate 110 and a second III-V compound layer 114 formed on the first layer 112. The first layer 112 and the second layer 114 are compounds made from the III-V groups in the periodic table of elements; however, the first layer 112 and the second layer 114 are different from each other in composition. In one embodiment of the semiconductor structure 100, the first layer 112 includes a gallium nitride (GaN) layer (also referred to as the GaN layer 112). The GaN layer 112 can be epitaxially grown by a number of processes including, but not limited to, metal organic chemical vapor deposition (MOCVD), also known as metal organic vapor phase epitaxy (MOVPE), using appropriate nitrogen and gallium containing precursors. For example, exemplary gallium containing precursors are trimethlgallium (TMG), triethylgallium (TEG) or other suitable chemical precursors. Exemplary nitrogen precursors include, but are not limited to, phenyl hydrazine, dimethylhydrazine, tertiarybutylamine, ammonia, or other suitable chemical precursors.

In the depicted embodiment, the second layer 114 includes an aluminum gallium nitride (AlGaN) layer (also referred to as the AlGaN layer 114). The AlGaN layer 114 can be epitaxially grown by MOCVD using appropriate aluminum, nitrogen and gallium precursors. The aluminum precursor includes trimethylaluminum (TMA), triethylaluminum (TEA), or suitable chemical precursors. Exemplary gallium containing precursors are trimethlgallium (TMG), triethylgallium (TEG) or other suitable chemical precursors. Exemplary nitrogen precursors include, but are not limited to, phenyl hydrazine, dimethylhydrazine, tertiarybutylamine, ammonia, or other suitable chemical precursors. The second layer 114 can also be referred to as a barrier layer. The GaN layer 112 and AlGaN layer 114 directly contact each other. A transition layer, usually present between the substrate 110 and the first layer 112, is not shown. A band gap discontinuity between the GaN layer 112 and the AlGaN layer 114, along with the piezo-electric effect, creates a very thin layer 116 of highly mobile conducting electrons in the GaN layer 112. This thin layer 116 is referred to as a two-dimensional electron gas (2-DEG) and forms a carrier channel. The thin layer 116 of 2-DEG is located at the interface of the GaN layer 112 and the AlGaN layer 114. In one embodiment, the AlGaN layer is a $Al_xGa_{1-x}N$ 115 layer as depicted in FIG. 1d.

The semiconductor structure 100 can also include source and drain features or contacts 130 formed on the substrate 110 which are configured to electrically connect to the channel. The source and drain contacts 130 include one or more conductive materials such as titanium, aluminum, nickel, gold or combination of titanium, aluminum and titanium nitride or other conductive materials. The source and drain contacts 130 can be formed by a process such as, but not limited to, a physical vapor deposition (PVD) technique or other suitable technique. Additionally, a thermal annealing process can be applied to the source and drain contacts 130 such that the source and drain contacts 130 and the AlGaN layer 114 react to form an alloy for effective electrical connection from the contacts 130 to the channel. As one non-limiting example, a rapid thermal annealing (RTA) process is utilized for the thermal annealing.

A gate stack 120a-c is formed on the AlGaN layer 114 and is interposed between the source and drain contacts 130. The gate stack 120a-c includes a conductive material layer, such as a metal layer 128 that functions as a gate electrode configured for voltage bias and electrical coupling with the channel. In a non-limiting example, the metal layer 128 includes titanium, molybdenum, platinum, chromium, tungsten, nickel or gold. The gate stack 120a-c includes one or more junction isolation features disposed underlying the metal layer 128. In one embodiment of the gate stack 120a, the junction isolation feature includes one n-type doped semiconductor layer 126, one p-type doped semiconductor layer 122 adjacent the AlGaN layer 114, and one aluminum nitride (AlN) layer 124 disposed between the n-type doped layer 126 and p-type doped layer 122, the layers configured as a diode. In one embodiment, the AlN layer 124 can be formed by MOCVD or another suitable technique. In another embodiment, the AlN layer 124 has a thickness ranging from approximately 0.7 nm to approximately 3 nm. In one embodiment, the gate stack 120a results in a device yielding an enhancement mode (E-mode) device. In the present embodiment, the n-type doped semiconductor layer 126 and p-type doped semiconductor layer 122 are a n-type doped III-V compound layer and a p-type doped III-V compound layer, respectively. In another embodiment, the n-type doped III-V compound layer is a n-type doped GaN layer (a n-GaN layer), and the p-type doped III-V compound layer is a p-type doped GaN layer (p-GaN layer). The n-GaN layer 126 is doped by a n-type dopant, such as, but not limited to, silicon, oxygen, or a combination thereof. In one embodiment, the n-GaN layer 126 can be formed by MOCVD or another suitable technique. In another embodiment, the n-GaN layer 126 has a thickness ranging from approximately 1 nm to approximately 100 nm. The p-GaN layer 122 is doped by a p-type dopant, such as, but not limited to, magnesium, calcium, zinc, beryllium, carbon, and combinations thereof. In one embodiment, the p-GaN layer 122 can be formed by MOCVD or another suitable technique. In another embodiment, the p-GaN layer 122 has a thickness ranging from approximately 1 nm to approximately 100 nm. In the embodiment depicted in FIG. 1a, the gate stack 120a, the source and drain contacts 130, and the 2-DEG channel 116 in the GaN layer 112 are configured as an E-mode transistor, where when a positive voltage applied to the gate stack for forward bias is great enough, the E-mode transistor is turned on. Such a configured transistor is also referred to as an E-mode high electron mobility transistor (HEMT).

Figure 1B:
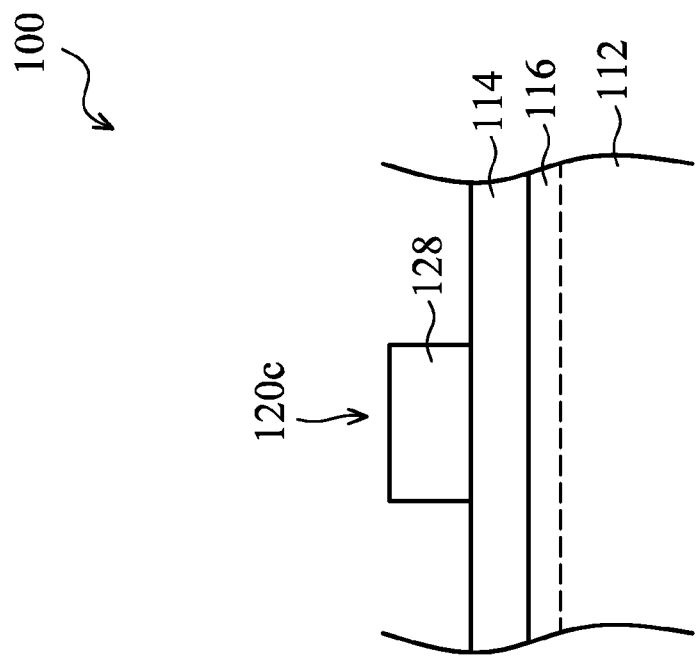

In a further embodiment depicted in FIG. 1b, if the metal layer 128 of the gate stack 120b is placed in direct contact with the AlN layer 124 which is disposed over a p-type doped layer 122 adjacent the AlGaN layer 114, the resulting device yields a shottky barrier diode or a low threshold voltage E-mode device. In one embodiment, the AlN layer 124 can be formed by MOCVD or another suitable technique. In another embodiment, the AlN layer 124 has a thickness ranging from approximately 0.7 nm to approximately 3 nm. In one embodiment, the p-type doped layer 122 is a p-GaN layer. The p-GaN layer 122 is doped by a p-type dopant, such as, but not limited to, magnesium, calcium, zinc, beryllium, carbon, and combinations thereof. In one embodiment, the p-GaN layer 122 can be formed by MOCVD or another suitable technique. In another embodiment, the p-GaN layer 122 has a thickness ranging from approximately 1 nm to approximately 100 nm.

Figure 1C:
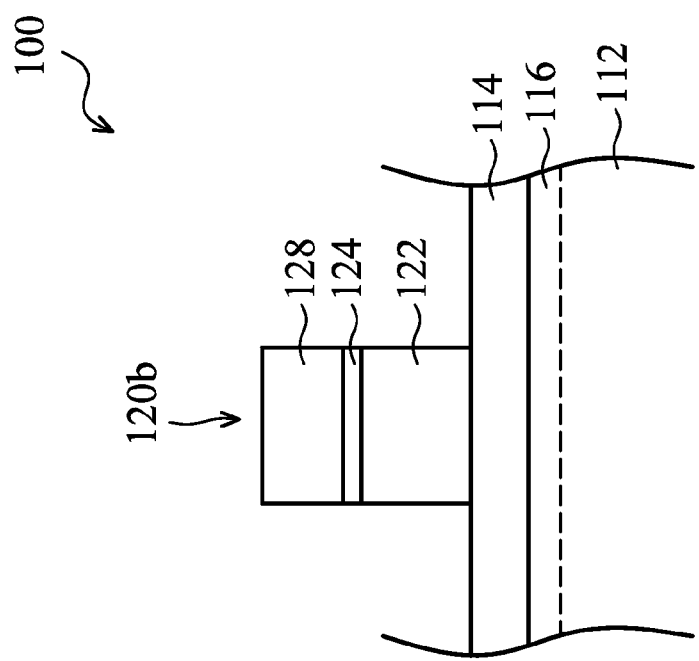
Figure 1D:
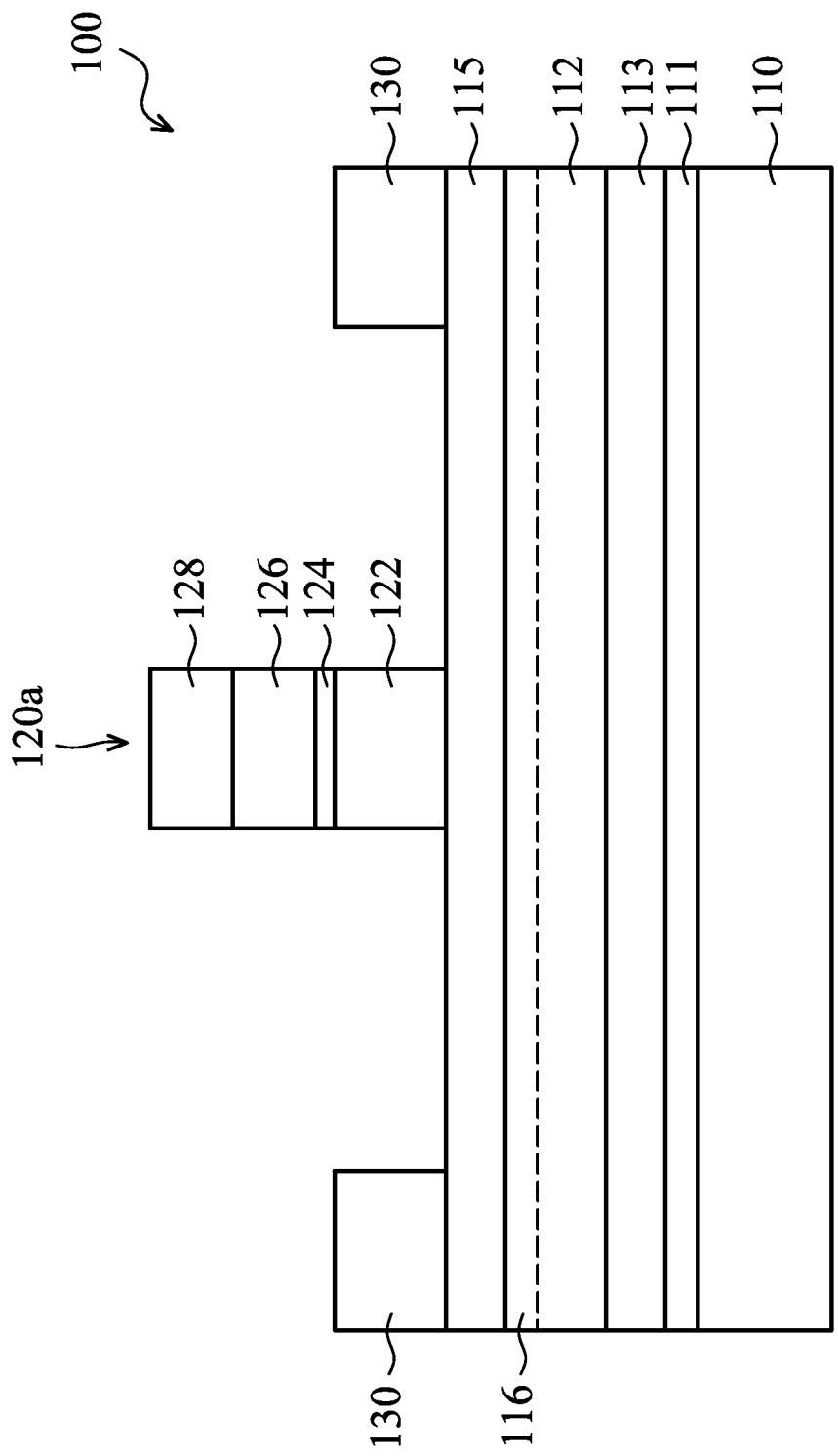

In another embodiment depicted in FIG. 1c, if the metal layer 128 of the gate stack 120c is placed in direct contact with the AlGaN layer 114, the resulting device yields a depletion mode (D-mode) device. In the embodiment depicted in FIG. 1c, the gate stack 120c, the source and drain features 130, and the 2-DEG channel 116 in the GaN layer 112 are configured as an D-mode transistor, where the device is normally on at zero gate-source voltage. Thus, the D-mode transistor can be turned off by pulling the gate with a negative voltage. Such a configured transistor is also referred to as an D-mode high electron mobility transistor (HEMT).

In another embodiment depicted in FIG. 1d, the semiconductor structure 100 includes a buffer layer 111 formed on the substrate 110 and a graded AlGaN layer 113 formed on the buffer layer 111. A GaN layer 112 is formed on the graded AlGaN layer 113, and a $Al_xGa_{1-x}N$ 115 layer is formed on the GaN layer 112. Any one or several of the gate stacks 120a-c having the compositions and structures previously described can be formed on the semiconductor structure depicted in FIG. 1d. While not specifically discussed, other advantages can be present in different embodiments. For example, the threshold voltage of a corresponding E-mode device can be adjusted by varying the doping and/or the thickness of the respective semiconductor layers. Thus, the claims appended herewith should not be limited to the examples described herein. In some embodiments of the present disclosure, a thin AlN layer can enlarge the gate barrier height in an exemplary gate stack having a n-GaN layer, a AlN layer, a p-GaN layer, and a AlGaN layer versus the gate barrier height of a gate stack having a n-GaN layer, a p-GaN layer, and a AlGaN layer. In other embodiments of the present disclosure, gate stacks including a AlN layer versus a gate stack having a AlGaN layer results in a greater etching selectivity.

FIGS. 2 through 9 are sectional views of semiconductor structures according to various embodiments. With reference to FIGS. 2 through 9, the semiconductor structure 100 and method of forming the semiconductor structure 100 includes forming a buffer layer 111 on a substrate 110 and forming a graded AlGaN layer 113 on the buffer layer 111. A GaN layer 112 is then formed on the graded AlGaN layer 113, and a $Al_xGa_{1-x}N$ 115 layer is formed on the GaN layer 112. Each of these layers can be epitaxially formed as noted above. The semiconductor structure 100 can include any one or several of the layers depicted in FIGS. 1a through 1d and the embodiments illustrated in FIGS. 2 through 9 should not limit the scope of the claims appended herewith. It should further be noted that the semiconductor structures 100 depicted in FIGS. 2 through 9 are illustrated in various stages of formation, each figure having three separate sections for simplicity, a section 140 for a high threshold voltage E-mode device such as an E-mode HEMT, a section 142 for a low threshold voltage E-mode device 142 such as a shottky barrier diode or low threshold voltage E-mode HEMT, and a section 144 for a D-mode device 144 such as a D-mode HEMT. Semiconductor devices according to embodiments herein, however, can include any one or combination of such semiconductor sections 140, 142, 144 and the depiction of all three devices and formation thereof in FIGS. 2 through 9 should not limit the scope of the claims appended herewith.

Figure 2:
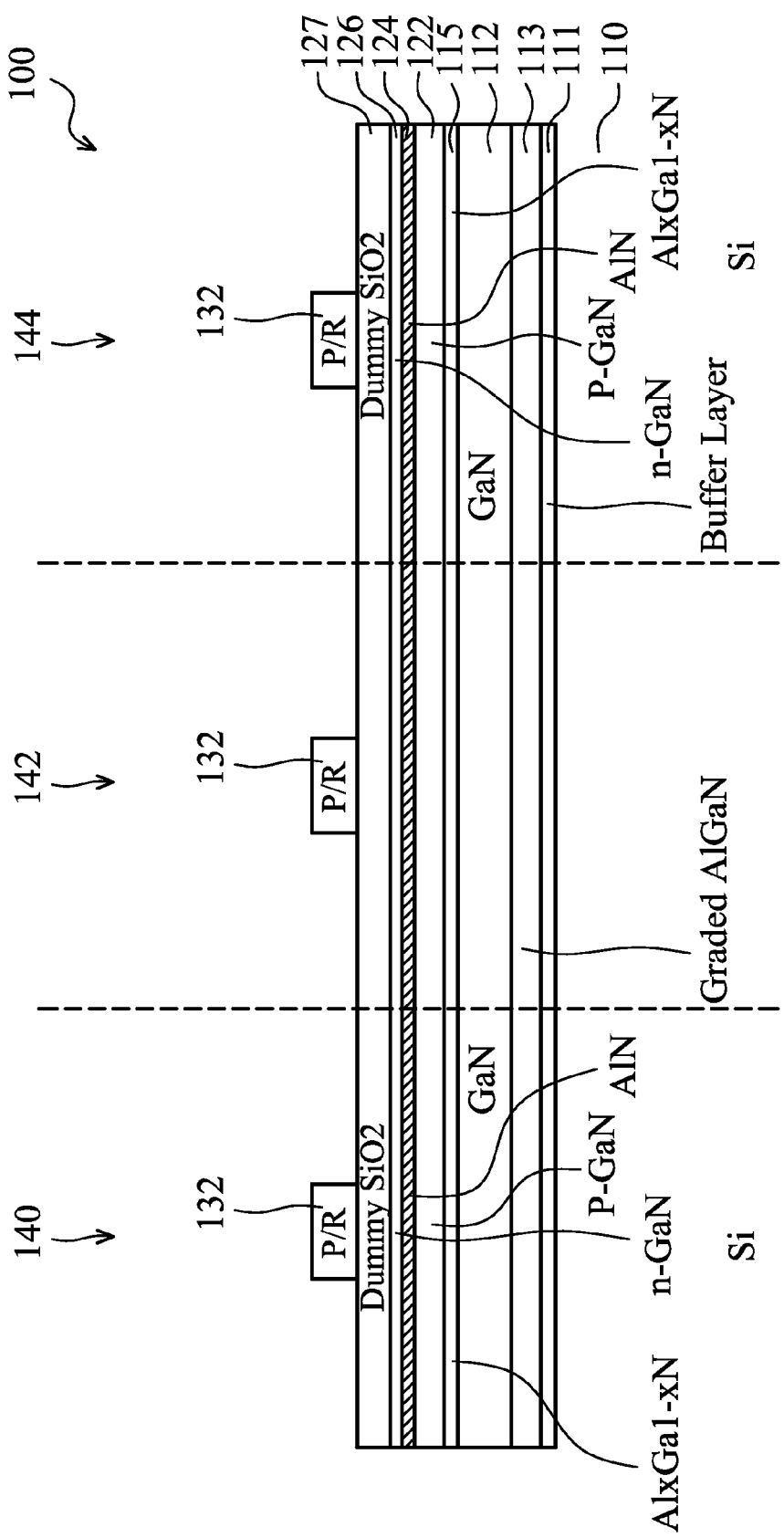
FIGS. 2-9 are sectional views of semiconductor structures according to various embodiments.

With continued reference to FIG. 2, a p-type doped semiconductor layer 122 is formed adjacent the $Al_xGa_{1-x}N$ layer 115, an AlN layer 124 is disposed over the p-type doped semiconductor layer 122, and a n-type doped semiconductor layer 126 is formed over the AlN layer 124. In the current embodiment depicted in FIGS. 2 through 9, the n-type doped semiconductor layer 126 is a n-GaN layer and the p-type doped semiconductor layer 122 is a p-GaN layer. A dielectric layer 127 can be formed on the n-GaN layer 126 to facilitate the formation of an exemplary gate structure. In one embodiment, the dielectric layer is a silicon dioxide ($SiO_2$) layer. This silicon dioxide ($SiO_2$) layer 127 is conventionally known as a sacrificial or dummy layer of dielectric material used to form dummy fill structures prior to subsequent planarization steps. Such insulative dummy fill structures or layers allow the use of less precise lithography and etching methods and can provide support during chemical metal planarization processes. As the dummy layers are made of a dielectric rather than conductive materials, the risk of shorts between levels of metallization and between active devices and lines of metallization is reduced. After deposition of the dielectric layer 127, a photoresist material 132 is deposited or coated over one or more selected portions of the dielectric layer 127 to define respective gate areas 102*a-c* for a resulting semiconductor device as illustrated in FIGS. 1*a-d*.

Figure 3:
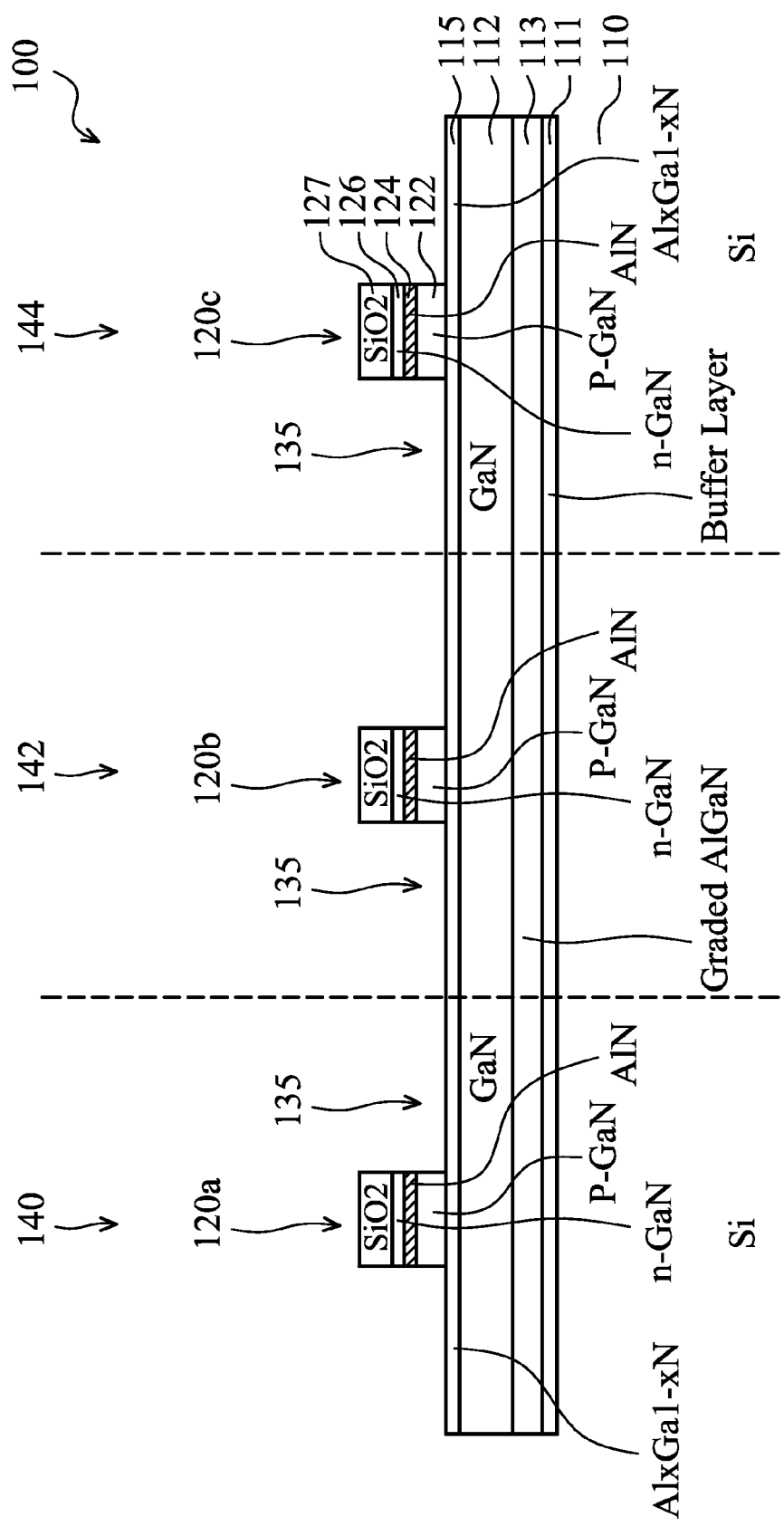
Figure 4:
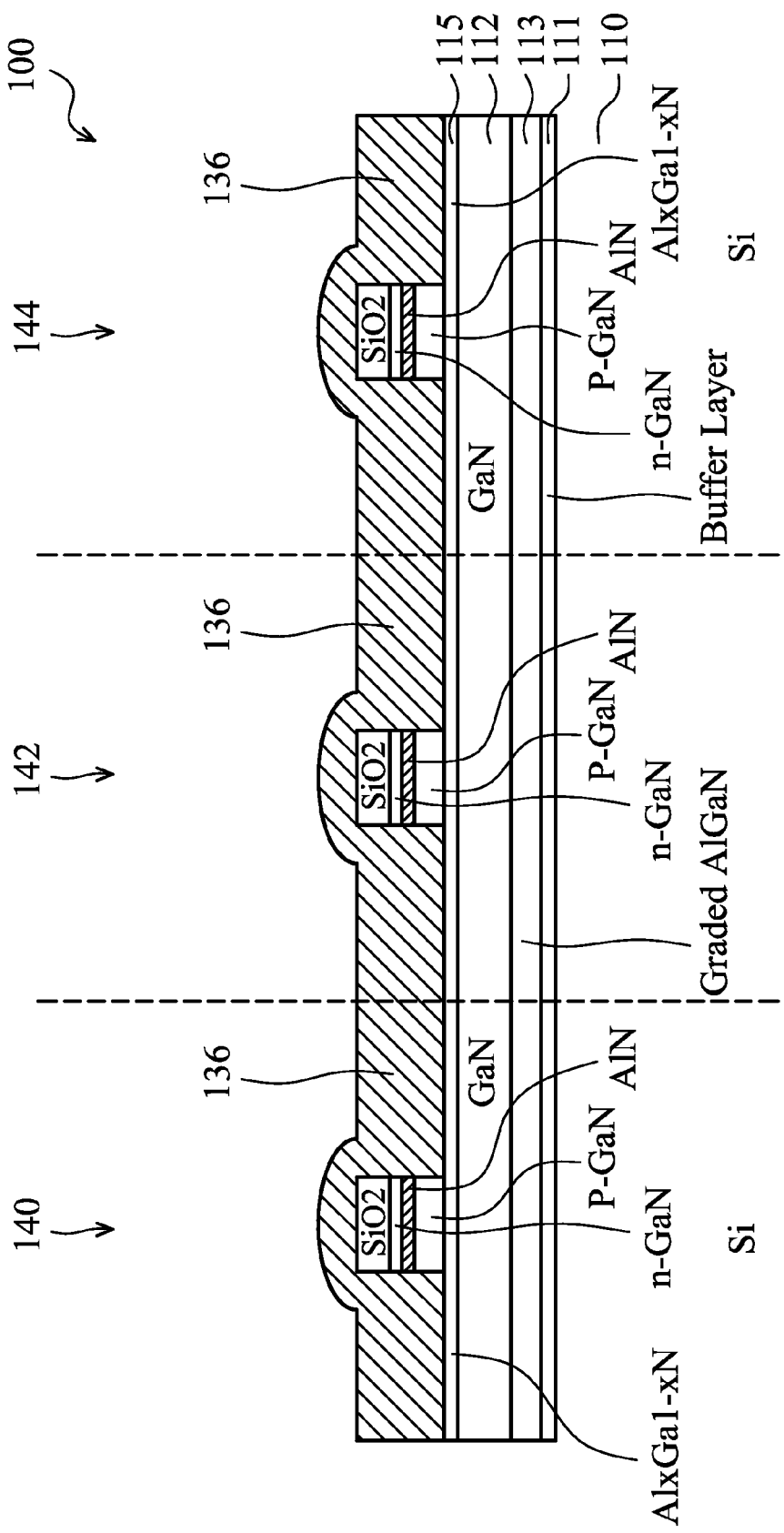

With reference to FIG. 3, unprotected or unmasked parts of the semiconductor structure 100 are etched down to the $Al_xGa_{1-x}N$ 115 layer to form access regions 135 and one or more gate stacks 120*a-c*. The photoresist can also be appropriately stripped. Suitable etching techniques include sputter etching, reactive gas etching, chemical etching and ion milling. In one embodiment, the etching technique includes exposing the unprotected material to a bombardment of ions to remove or etch portions of material from the exposed, unprotected surface. Exemplary ions include a plasma of reactive gases such as a plasma of fluorine-base, chlorine-base and other gases. Such etching techniques are accomplished using a vacuum chamber, gas delivery system, a radio frequency (RF) generator, and exhaust system. With reference to FIG. 4, a first layer of silicon nitride 136 is deposited onto the semiconductor structure 100. Exemplary silicon nitrides (SiN) include amorphous SiN, trisilicon tetranitride, disilicon mononitride, and silicon mononitride. The first silicon nitride layer 136 can be deposited using a low pressure chemical vapor deposition or other suitable process. The first silicon nitride layer 136 is then smoothed using a suitable process such as chemical mechanical planarization (CMP) or other process. An exemplary CMP process employs a colloid in conjunction with a polishing pad and retaining ring to remove material and even out irregular topography on a semicondutor surface to ensure a flat surface prior to any subsequent lithography. The first silicon nitride layer 136 can also be subjected to a suitable dry etch back technique to selectively reduce the thickness of the layer 136.

Figure 5:
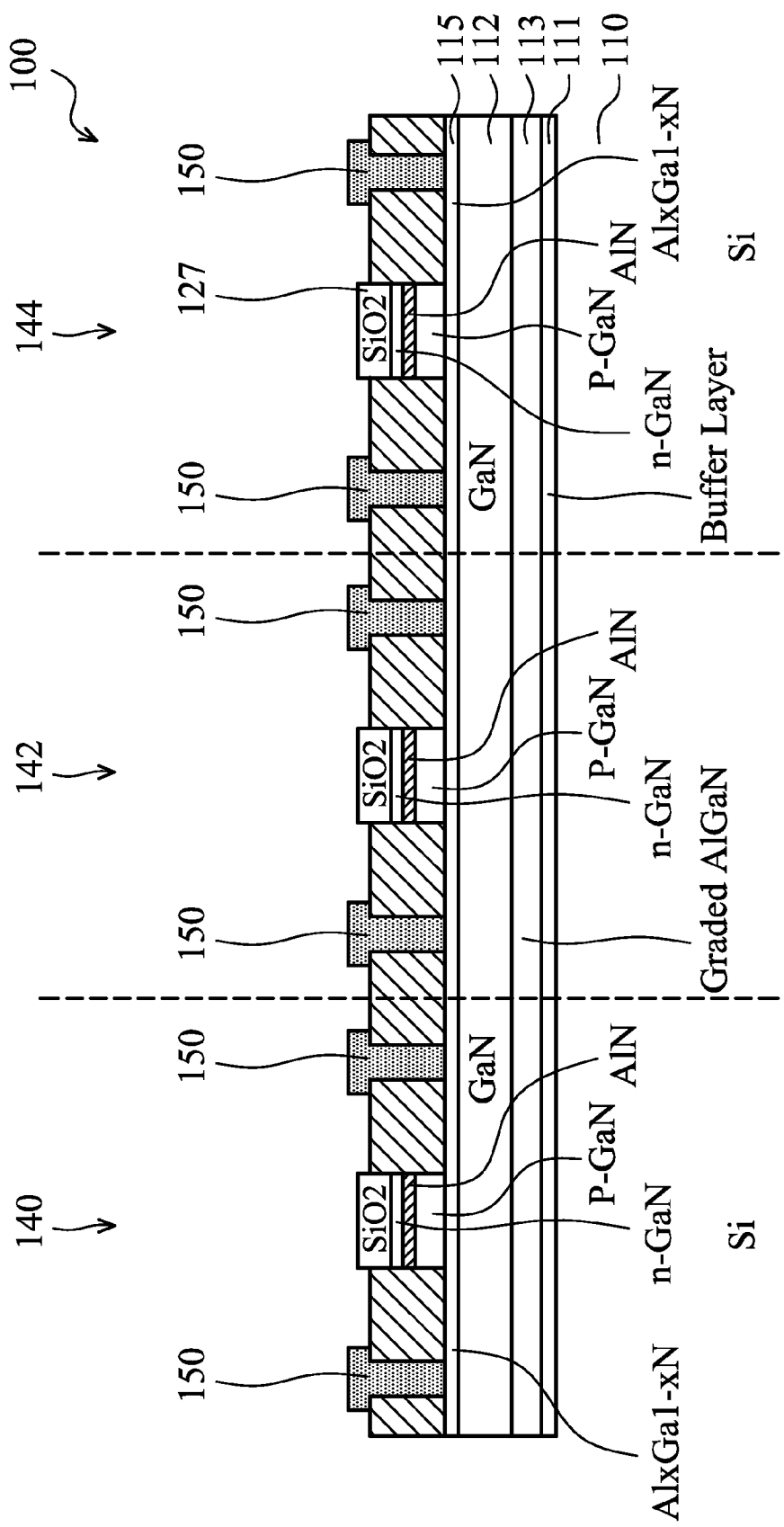

With reference to FIG. 5, ohmic contacts 150 are fabricated for the semiconductor structure 100 by defining one or more ohmic regions in the first silicon nitride layer 136 and depositing a suitable ohmic material in the defined ohmic regions. In one embodiment, to form an appropriate ohmic region, the first silicon nitride layer 136 is selectively etched and cleaned. Exemplary etching processes include sputter etching, reactive gas etching, chemical etching and ion milling. A suitable ohmic metal is then deposited in the ohmic region via sputter deposition, evaporation or chemical vapor deposition (CVD). Exemplary ohmic metals include, but are not limited to, titanium, aluminum and titanium nitride. Post deposition annealing of the ohmic metal is then performed to induce any desirable reactions between the ohmic metal and the adjacent $Al_xGa_{x-1}N$ 115 layer. In one embodiment, the ohmic contact 150 is formed by rapid thermal annealing (RTA) at an annealing temperature ranging from approximately 800° C. to approximately 900° C. In another embodiment, RTA can be performed at an annealing temperature of 850° C.

Figure 6:
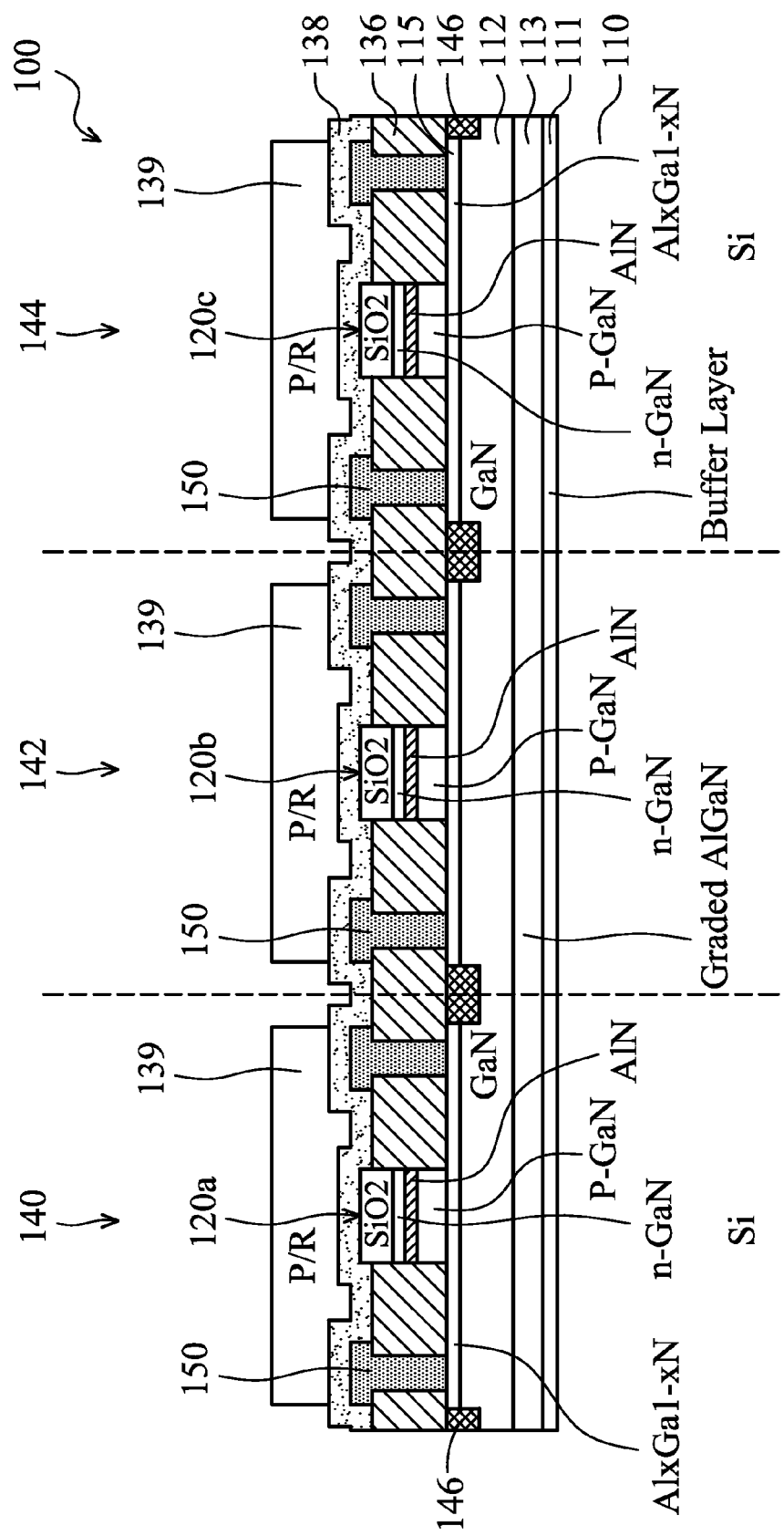

With reference to FIG. 6, a second layer of silicon nitride 138 is deposited over the ohmic contacts 150, gate structures 120*a-c*, and exposed portions of the first silicon nitride layer 136. In one embodiment, the second layer of silicon nitride 138 is deposited using a suitable vapor deposition processes (e.g., CVD) or another method. Exemplary silicon nitrides (SiN) include amorphous SiN, trisilicon tetranitride, disilicon mononitride, and silicon mononitride. In another embodiment, the second layer of silicon nitride 138 is deposited to a thickness ranging from 400 Å to 600 Å. In one embodiment, the thickness of the layer 138 is 500 Å. After deposition of the second silicon nitride layer 138, a photoresist material 139 is deposited or coated over selected portions of the silicon nitride layer 138.

In embodiments of an integrated or compound semiconductor structure 100 containing two or more sections 140, 142, 144, a high-resistivity region 146 is created to isolate adjacent devices. For example, in an embodiment having an E-mode HEMT 140, a shottky barrier diode 142, and a D-mode HEMT 144, high-resistivity or implant-isolation regions 146 are implanted to isolate each device from the others. In one embodiment, these implant-isolation regions 146 are created by ion bombardment using a neutral species such as oxygen, nitrogen, or argon to create damage-related deep levels in the $Al_xGa_{1-x}N$ 115 layers and/or the GaN layer 112. Using ion bombardment, isolation between adjacent devices results from the induced lattice damage and is dependent on a variety of parameters such as ion mass, dose, energy, and substrate temperature during implantation. In an alternative embodiment, these implant-isolation regions 146 are created by an implantation of a chemical species in the semiconductor material which, either by itself or in combination with impurities or dopants already present in the material, creates a chemically active deep-level state.

Figure 7:
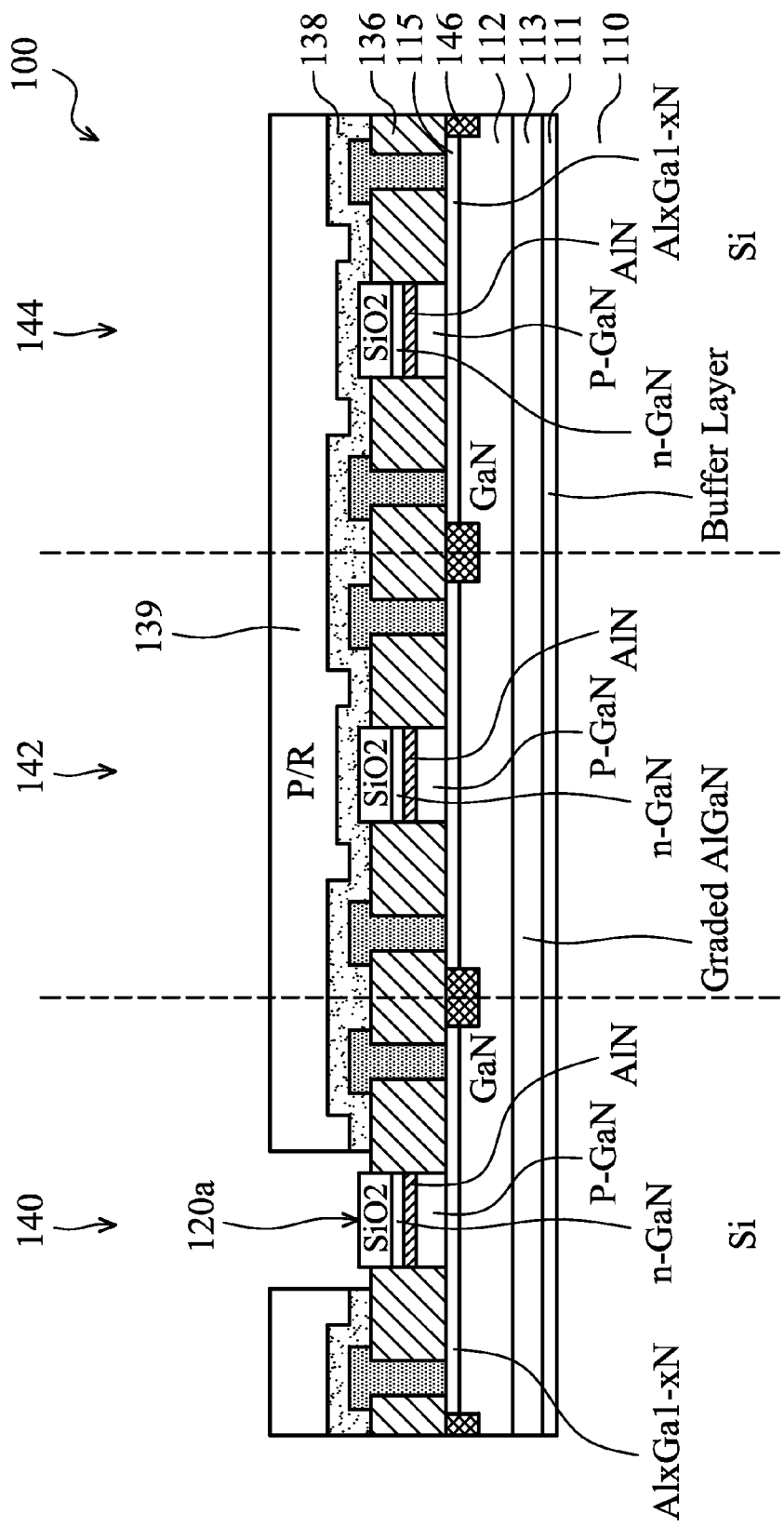
Figure 8:
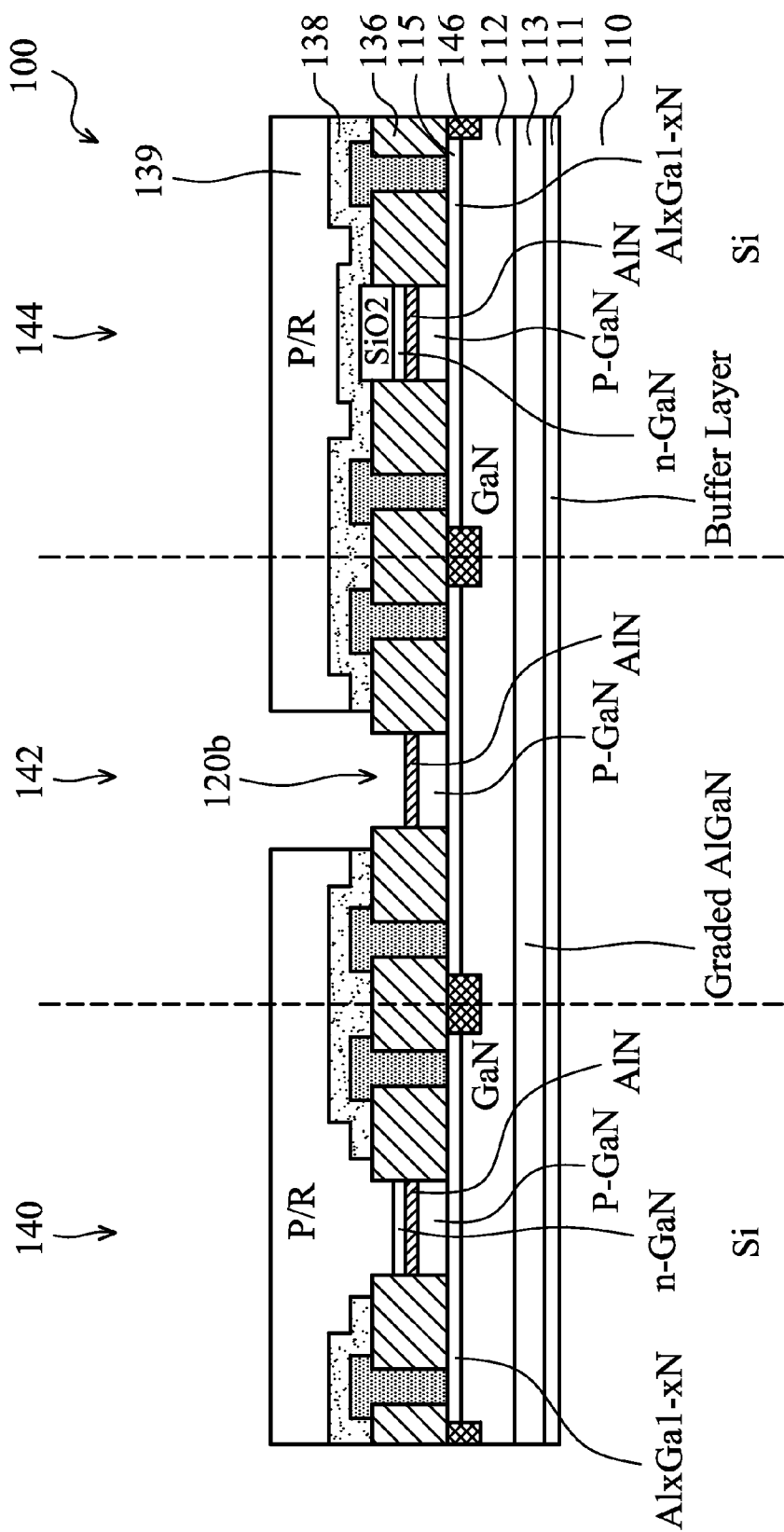
Figure 9:
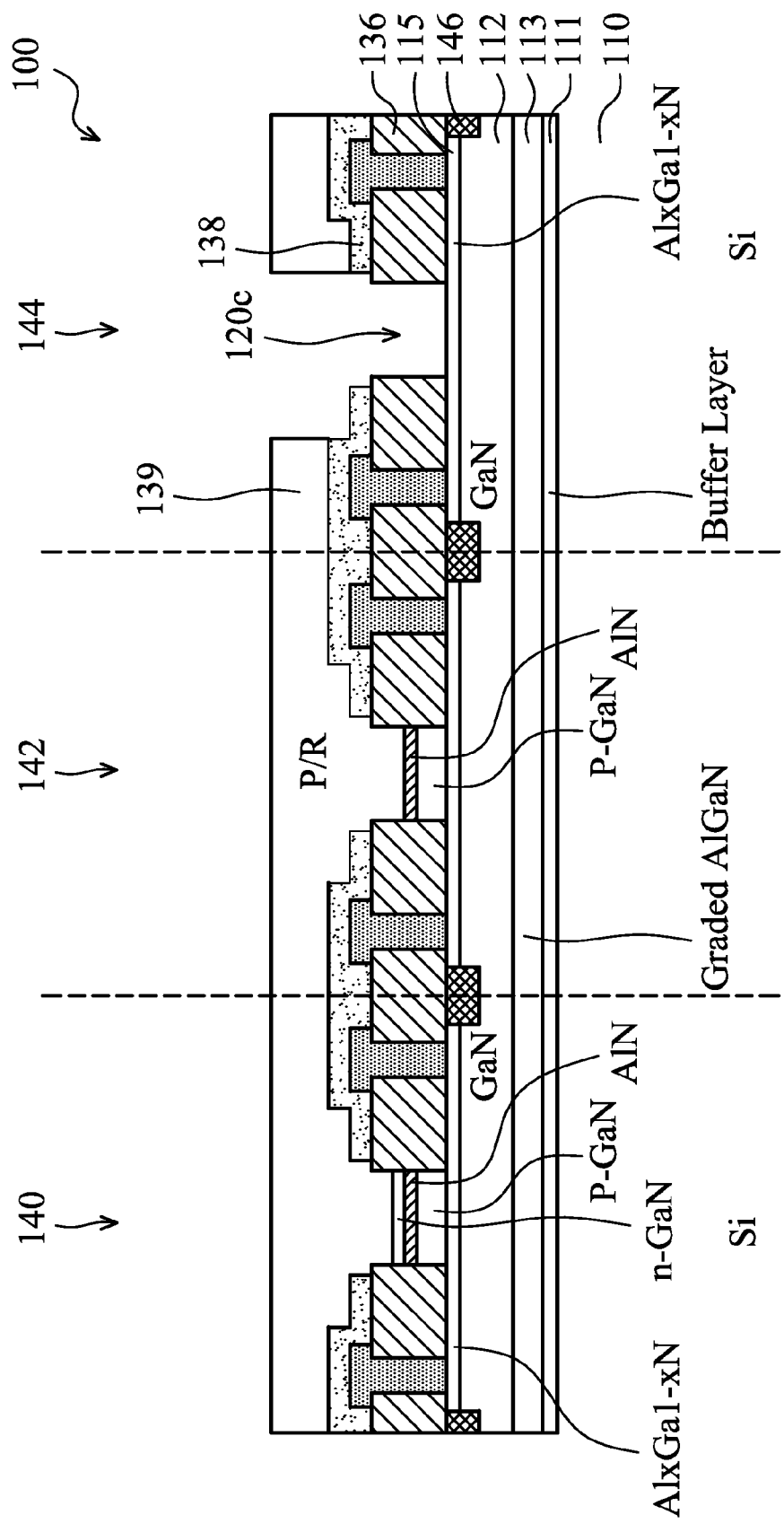

With reference to FIG. 7, an exemplary gate stack 120*a* for a high threshold voltage E-mode device is formed by selectively etching photoresist material 139, the second silicon nitride layer 138, and sacrificial or dummy layer 127 of dielectric material. Suitable etching techniques include exposing the unprotected material to a bombardment of ions and/or using a first mask to remove or etch portions of material from the exposed, unprotected surface. Additional photoresist material 139 can then be deposited on the gate stack 120*a* for subsequent etching processes in an integrated or compound semiconductor structure 100. With reference to FIG. 8, an exemplary gate stack 120*b* for a low threshold voltage E-mode device is formed by selectively etching photoresist material 139, the second silicon nitride layer 138, sacrificial or dummy layer 127 of dielectric material, and n-GaN layer 126 using a suitable etching technique and second mask. Additional photoresist material 139 can then be deposited on the gate stack 120*b* for subsequent etching processes in an integrated or compound semiconductor structure 100. With reference to FIG. 9, an exemplary gate stack 120*c* for a D-mode device is formed by selectively etching photoresist material 139, the second silicon nitride layer 138, sacrificial or dummy layer 127 of dielectric material, n-GaN layer 126, AlN layer 124, and p-GaN layer 122 using a suitable etching technique and a third mask. Any photoresist material 139 can then be stripped as necessary.

Figure 10:
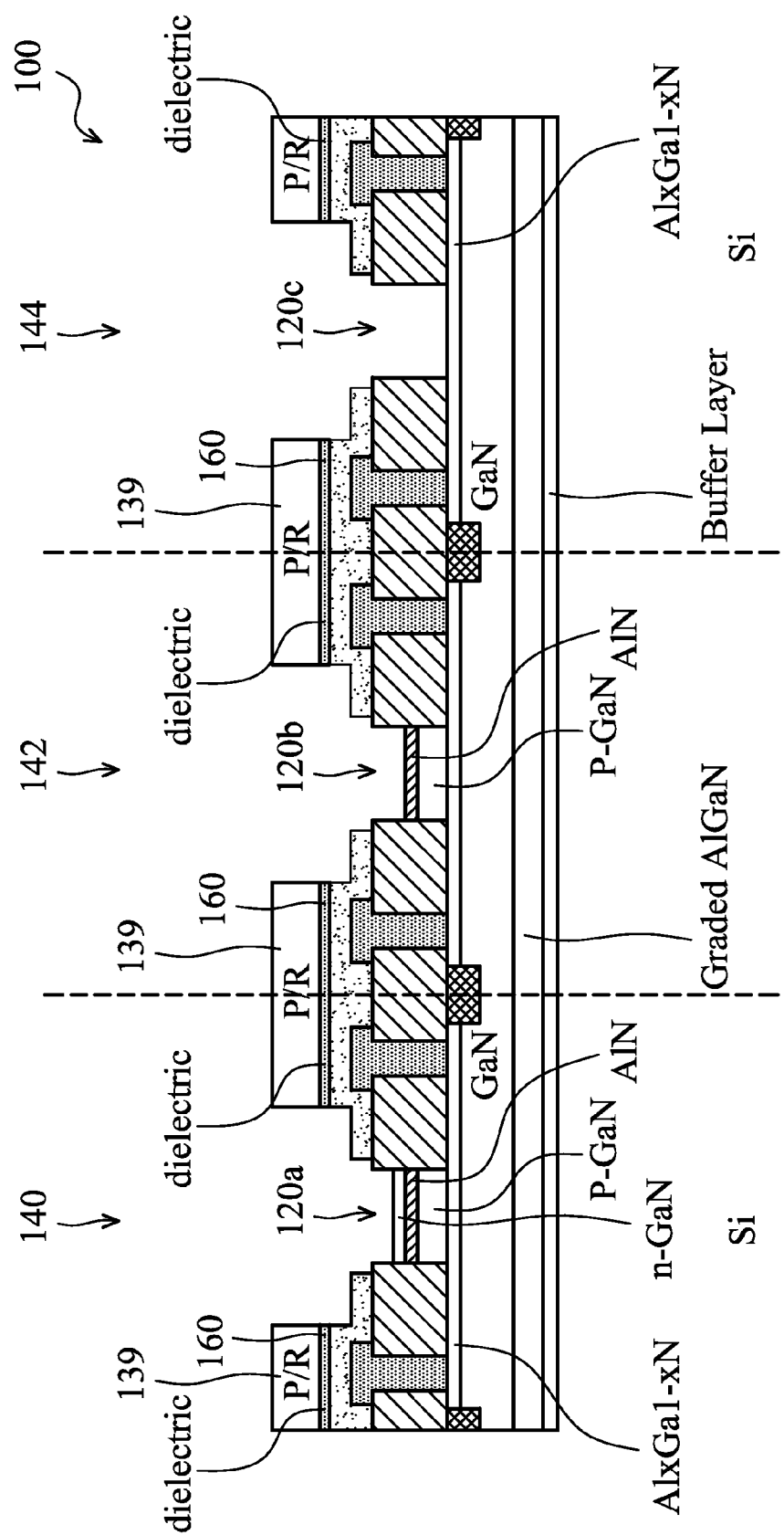
FIGS. 10 through 12 are sectional views of a compound semiconductor structure having a high threshold voltage E-mode HEMT, a low threshold voltage E-mode HEMT, and a D-mode HEMT.
Figure 11:
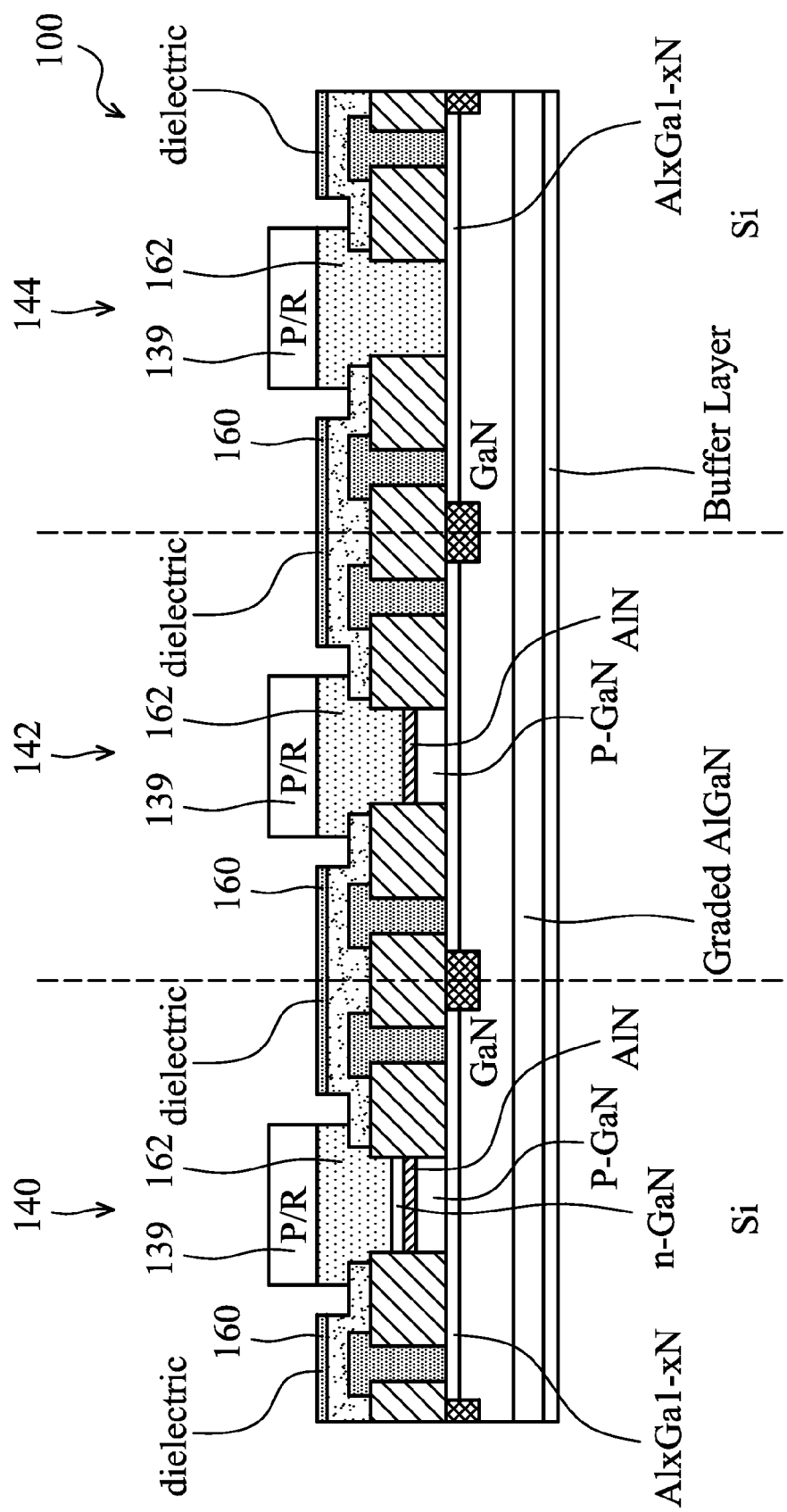
Figure 12:
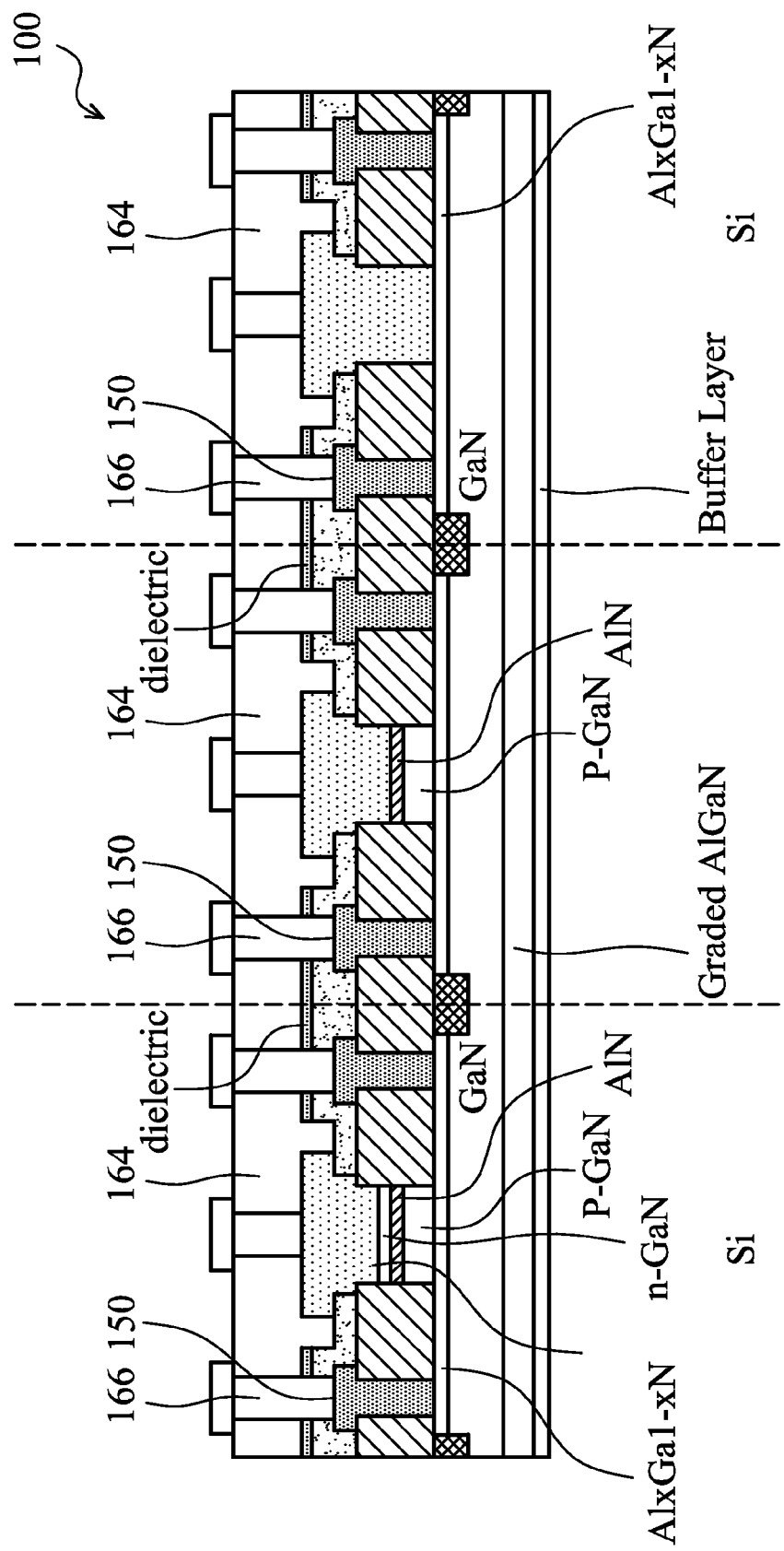

FIGS. 10 through 12 are sectional views of a compound semiconductor structure having a high threshold voltage E-mode HEMT, a low threshold voltage E-mode HEMT, and a D-mode HEMT. With reference to FIGS. 10 through 12, the illustrated semiconductor structures 100 are similar to the semiconductor structures 100 illustrated in FIGS. 1*a* through 1*d* but further include a dielectric material layer (or insulting layer) 160 formed on the device. For example, an exemplary method of forming the semiconductor structure 100 further includes depositing a dielectric layer 160 onto the exposed surfaces of the structure 100 and depositing photoresist material 139 over selected portions of the dielectric layer 160 as illustrated in FIG. 10. The dielectric material layer 160 can be formed by any proper fabrication technique, such as MOCVD, chemical vapor deposition (CVD), PVD, atomic layer deposition (ALD), or thermal oxidation. The dielectric layer 160 includes a dielectric material such as, but not limited to, silicon dioxide ($SiO_2$), silicon nitride ($Si_3N_4$), aluminum oxide ($Al_2O_3$), tantalum oxide ($Ta_2O_5$), titanium oxide ($TiO_2$), zinc oxide ($ZnO_2$), hafnium oxide ($HfO_2$), and combinations thereof. In one embodiment, the dielectric material layer 160 has a thickness ranging between approximately 3 nm to approximately 100 nm.

Any unprotected sections of the dielectric layer 160 can be selectively etched by a suitable etching technique to leave a dielectric material layer 160 between adjacent sections 140, 142, 144 of the semiconductor structure 100. In one embodiment, an $Al_2O_3$ wet etching technique is utilized to remove exposed dielectric material. Any remaining photoresist material 139 can then be stripped. With reference to FIG. 11, a layer of suitable gate metal 162 is deposited onto the exposed surfaces of the structure 100 using sputter deposition, evaporation or chemical vapor deposition processes, and a layer of photoresist material 139 formed over portions of the gate metal layer 162. In a non-limiting example, a suitable gate metal includes titanium, molybdenum, platinum, chromium, tungsten, nickel or gold. Any unprotected sections of the gate metal layer 162 can be selectively etched by a suitable etching technique. Any remaining photoresist material 139 can then be stripped. With reference to FIG. 12, in embodiments having layers of electrical conductors or semiconductors, a layer of electrically insulating material 164 can be deposited on the semiconductor structure 100. In one embodiment, the layer 164 is a dielectric material. Any suitable interlayer dielectric material can be used in the layer 164. Suitable caps and/or plugs 166 can then be provided through the layer of electrically insulating material 164 contacting the ohmic contacts 150 to thereby separate and/or align the semiconductor structure 100 with a spatially adjacent conductor or semiconductor not shown.

Figure 13:
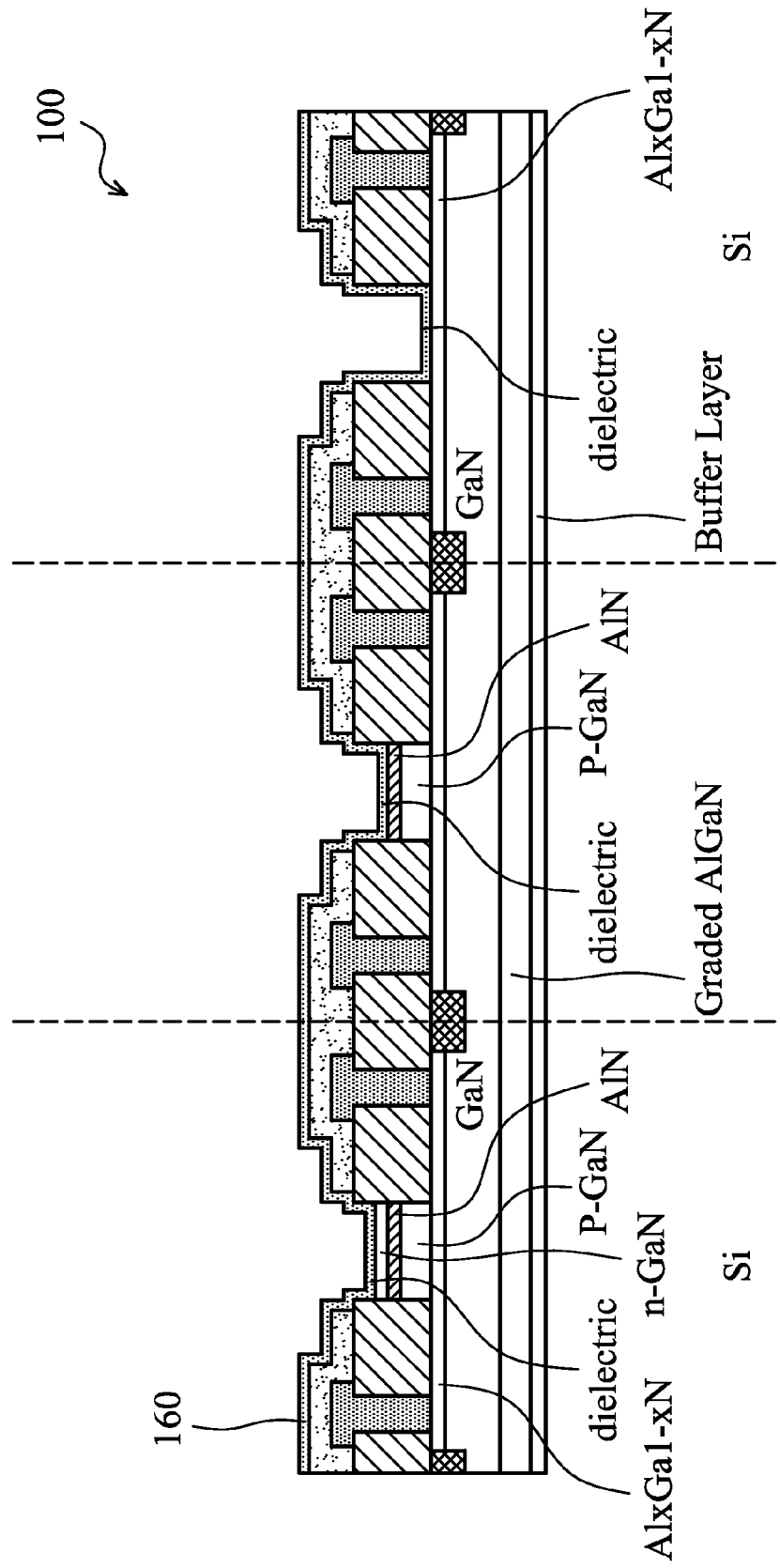
FIGS. 13 through 15 are sectional views of a compound semiconductor structure having a high threshold voltage E-mode MISFET, a low threshold voltage E-mode MISFET, and a D-mode MISFET.
Figure 14:
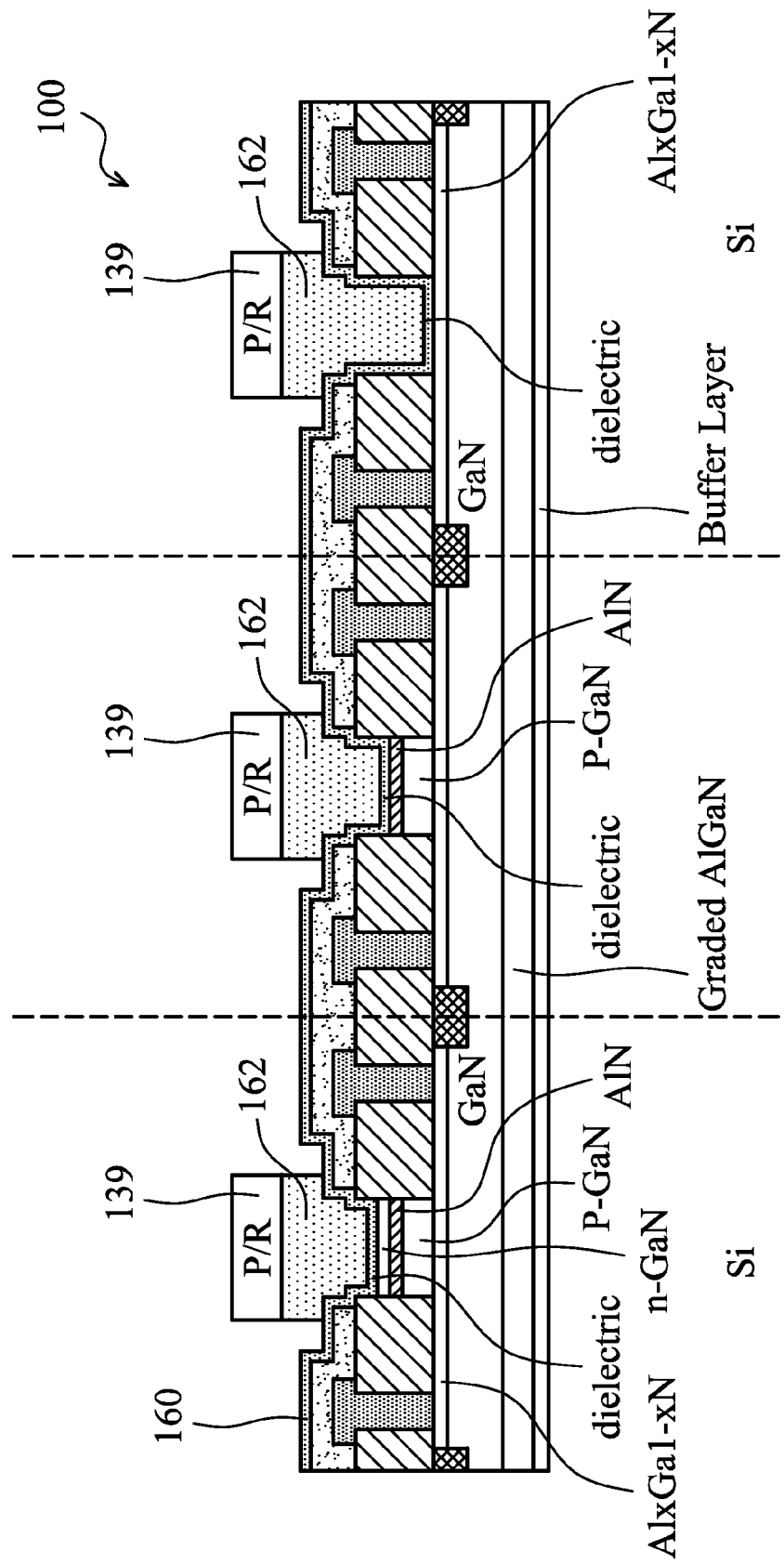
Figure 15:
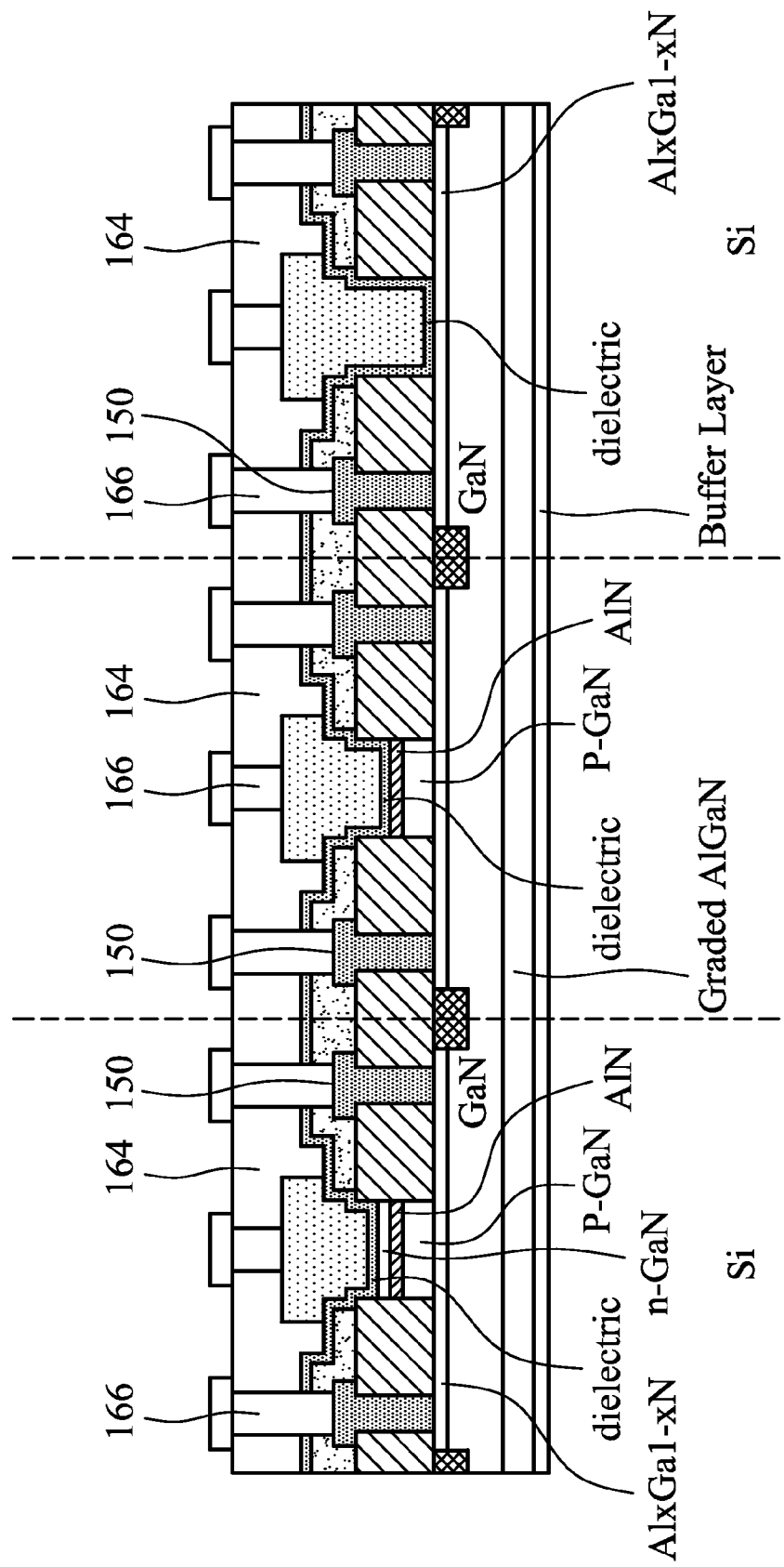

FIGS. 13 through 15 are sectional views of a compound semiconductor structure having a high threshold voltage E-mode metal insulator semiconductor field effect transistors (MISFET), a low threshold voltage E-mode MISFET, and a D-mode MISFET. With reference to FIGS. 13 through 15, the semiconductor structure 100 and method of forming the semiconductor structure 100 further includes depositing a dielectric layer 160 onto the exposed surfaces of the structure 100. The dielectric material layer 160 can be formed by any proper fabrication technique, such as MOCVD, CVD, PVD, ALD, or thermal oxidation. The dielectric layer 160 includes a dielectric material such as, but not limited to, $SiO_2$, $Si_3N_4$, $Al_2O_3$, $Ta_2O_5$, $TiO_2$, $ZnO_2$, $HfO_2$, and combinations thereof. In one embodiment, the dielectric material layer 160 has a thickness ranging between approximately 3 nm to approximately 100 nm.

With reference to FIG. 14, a layer of suitable gate metal 162 is deposited onto the exposed surfaces of the structure 100 using sputter deposition, evaporation, or chemical vapor deposition processes, and a layer of photoresist material 139 formed over portions of the gate metal layer 162. In a non-limiting example, a suitable gate metal includes titanium, molybdenum, platinum, chromium, tungsten, nickel or gold. Any unprotected sections of the gate metal layer 162 can be selectively etched by a suitable etching technique. Any remaining photoresist material 139 can then be stripped. With reference to FIG. 15, in embodiments having layers of electrical conductors or semiconductors, a layer of electrically insulating material 164 can be deposited on the semiconductor structure 100. In one embodiment, the layer 164 is a dielectric material. Any suitable interlayer dielectric material can be used in the layer 164. Suitable caps and/or plugs 166 can then be provided through the layer of electrically insulating material 164 contacting the ohmic contacts 150 to thereby separate and/or align the semiconductor structure 100 with a spatially adjacent conductor or semiconductor not shown.

In one embodiment a semiconductor structure provided having a GaN layer on a substrate, a AlGaN disposed on the GaN layer, and a first gate stack disposed on the AlGaN layer. The gate stack includes a III-V compound p-type doped layer adjacent the AlGaN layer, a AlN layer disposed on the III-V compound p-type doped layer, a III-V compound n-type doped layer disposed on the AlN layer, and a metal layer disposed on the III-V compound n-type doped layer. In another embodiment, the III-V compound p-type doped layer is a p-doped GaN layer and the III-V compound n-type doped layer is a n-doped GaN layer. In a further embodiment, the III-V compound p-type doped layer is doped with an impurity selected from the group consisting of magnesium, calcium, zinc, beryllium, carbon, and combinations thereof, and the III-V compound n-type doped layer is doped with an impurity selected from the group consisting of silicon and oxygen. One embodiment can include a dielectric layer underlying the metal layer and disposed on the III-V compound n-type doped layer. The dielectric layer can include a compound selected from the group consisting of $SiO_2$, $Si_3N_4$, $Al_2O_3$, $Ta_2O_5$, $TiO_2$, $ZnO_2$, $HfO_2$, and combinations thereof. In a further embodiment, the structure can include source and drain contacts configured with the first gate stack to form an enhancement mode device. An alternative embodiment can include a second gate stack disposed on the AlGaN layer and isolated from the first gate stack. The second gate stack includes a III-V compound p-type doped layer adjacent the AlGaN layer, a AlN layer disposed on the III-V compound p-type doped layer, and a metal layer disposed on the AlN layer. A third gate stack can also be disposed on the AlGaN layer and isolated from the first and second gate stacks, the third gate stack including a metal layer disposed adjacent the AlGaN layer.

In another embodiment a compound semiconductor structure is provided having a GaN layer on a substrate, a AlGaN disposed on the GaN layer, and a first gate stack disposed on the AlGaN layer and between a first set of source and drain contacts to form a high threshold voltage enhancement mode device. The first gate stack includes a III-V compound p-type doped layer adjacent the AlGaN layer, a AlN layer disposed on the III-V compound p-type doped layer, a III-V compound n-type doped layer disposed on the AlN layer, and a metal layer disposed on the III-V compound n-type doped layer. The structure also includes a second gate stack disposed on the AlGaN layer and between a second set of source and drain contacts to form a low threshold voltage enhancement mode device. The second gate stack includes a III-V compound p-type doped layer adjacent the AlGaN layer, a AlN layer disposed on the III-V compound p-type doped layer, and a metal layer disposed on the AlN layer. The structure can also include a third gate stack disposed on the AlGaN layer and between a third set of source and drain contacts to form a depletion mode device where the third gate stack includes a metal layer disposed adjacent the AlGaN layer. The first, second and third gate stacks and respective sets of source and drain contacts are electrically isolated from each other. In a further embodiment, the first, second and third gate stacks each further include a dielectric layer underlying the metal layer.

One embodiment includes a method of forming a semiconductor structure. The method includes forming a GaN layer on a substrate, forming a AlGaN layer on the GaN layer, and forming a first gate stack on the AlGaN layer. The first gate stack includes a III-V compound p-type doped layer adjacent the AlGaN layer, a AlN layer disposed on the III-V compound p-type doped layer, a III-V compound n-type doped layer disposed on the AlN layer, and a metal layer disposed on the III-V compound n-type doped layer. In another embodiment, the method includes forming a second gate stack on the AlGaN layer. The second gate stack includes a III-V compound p-type doped layer adjacent the AlGaN layer, a AlN layer disposed on the III-V compound p-type doped layer, and a metal layer disposed on the AlN layer. The second gate stack should then be isolated from the first gate stack. In a further embodiment, the method includes forming a third gate stack on the AlGaN layer, the third gate stack including a metal layer disposed adjacent the AlGaN layer, and then isolating the third gate stack from the first and second gate stacks. An alternative embodiment includes forming a dielectric layer underlying the metal layer of one or more of the first, second and third gate stacks.

It can be emphasized that the above-described embodiments, particularly any "preferred" embodiments, are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous.

As shown by the various configurations and embodiments illustrated in FIGS. 1-15, a compound semiconductor device having gallium nitride gate structures have been described.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What is claimed is:

1. A method of forming a semiconductor structure comprising the steps of:
   forming an aluminum gallium nitride layer (AlGaN) on a GaN layer; and
   forming a first gate stack on the AlGaN layer, the first gate stack including:
      a III-V compound p-type doped layer adjacent the AlGaN layer,
      an aluminum nitride (AlN) layer disposed on the III-V compound p-type doped layer,
      a III-V compound n-type doped layer disposed on the AlN layer,
      a metal layer disposed on the III-V compound n-type doped layer; and
   forming a second gate stack disposed on the AlGaN layer, the second gate stack being different from the first gate stack.

2. The method of claim 1, wherein the second gate stack comprises a metal layer.

3. The method of claim 2, wherein the second gate stack includes:
   a III-V compound p-type doped layer adjacent the AlGaN layer, and
   a AlN layer disposed on the III-V compound p-type doped layer,
   wherein the metal layer is disposed on the AlN layer.

4. The method of claim 2 further comprising the steps of:
   forming a third gate stack on the AlGaN layer, the third gate stack including a metal layer disposed adjacent the AlGaN layer; and
   isolating the third gate stack from the first and second gate stacks.

5. The method of claim 4, further comprising the step of forming a dielectric layer underlying the metal layer of one or more of the first, second and third gate stacks.

6. The method of claim 2, further comprising the step of forming a dielectric layer underlying the metal layer of the second gate stack.

7. The method of claim 1, further comprising the step of forming a dielectric layer underlying the metal layer of the first gate stack.

8. The method of claim 1, wherein the III-V compound p-type doped layer is a p-doped GaN layer and the III-V compound n-type doped layer is a n-doped GaN layer.

9. The method of claim 1, wherein the III-V compound p-type doped layer is doped with an impurity selected from the group consisting of magnesium, calcium, zinc, beryllium, carbon, and combinations thereof.

10. The method of claim 1, wherein the III-V compound n-type doped layer is doped with an impurity selected from the group consisting of silicon and oxygen.

11. A method of forming a semiconductor structure comprising the steps of:
    providing a substrate having an aluminum gallium nitride layer (AlGaN) on a GaN layer; and
    forming a first gate stack on the AlGaN layer, the first gate stack including:
       a III-V compound p-type doped layer adjacent the AlGaN layer,
       an aluminum nitride (AlN) layer disposed on the III-V compound p-type doped layer, and
       a III-V compound n-type doped layer disposed on the AlN layer, and
    forming a second gate stack disposed on the AlGaN layer and isolated from the first gate stack, the second gate stack having a metal layer on an AlN layer.

12. The method of claim 11, wherein the step of forming the first gate stack further comprises forming a metal layer disposed on the III-V compound n-type doped layer.

13. The method of claim 11, wherein step of forming the second gate stack further comprises forming a III-V compound p-type doped layer adjacent the AlGaN layer, the AlN layer of the second gate stack disposed on the III-V compound p-type doped layer of the second gate stack.

14. The method of claim 11, further comprising forming a dielectric layer on the III-V compound n-type doped layer, and forming a metal layer on the III-V compound n-type doped layer.

15. The method of claim 14, wherein the dielectric layer includes a compound selected from the group consisting of silicon dioxide ($SiO_2$), silicon nitride ($Si_3N_4$), aluminum oxide ($Al_2O_3$), tantalum oxide ($Ta_2O_5$), titanium oxide ($TiO_2$), zinc oxide ($ZnO_2$), hafnium oxide ($HfO_2$), and combinations thereof.

16. A method of forming a semiconductor structure comprising the steps of:
   forming an aluminum gallium nitride layer (AlGaN) on a GaN layer; and
   forming a first gate stack on the AlGaN layer, the first gate stack including:
      a III-V compound p-type doped layer on the AlGaN layer,
      a layer of aluminum nitride (AlN) on the III-V compound p-type doped layer; and
      a metal layer disposed on the AlN layer; and
   forming a second gate stack disposed on the AlGaN layer and isolated from the first gate stack, the second gate stack being different from the first gate stack.

17. The method of claim 16, further comprising the step of forming a third gate stack comprising forming a III-V compound p-type doped layer adjacent the AlGaN layer, and forming an AlN layer on the III-V compound p-type doped layer of the third gate stack.

18. The method of claim 16, further comprising forming a third gate stack, comprising:
   forming a III-V compound p-type doped layer adjacent the AlGaN layer,
   forming an aluminum nitride (AlN) layer on the III-V compound p-type doped layer,
   forming a III-V compound n-type doped layer on the AlN layer of the third gate stack; and
   forming a metal layer on the III-V compound n-type doped layer of the third gate stack.

19. The method of claim 16, further comprising forming a third gate stack on the AlGaN layer and isolated from the first and second gate stacks, the third gate stack including a dielectric layer above the AlGaN layer and a metal layer above the dielectric layer.

20. The method of claim 16, wherein the second gate stack includes a metal layer adjacent the AlGan layer.

* * * * *